United States Patent [19]
Kogure

[11] Patent Number: 6,019,231
[45] Date of Patent: Feb. 1, 2000

[54] HOLDING CASSETTE FOR PRECISION SUBSTRATES AND METHOD FOR THE PREPARATION THEREOF

[75] Inventor: Keiji Kogure, Niigata-ken, Japan

[73] Assignees: Shin-Etsu Polymer Co., Ltd.; Shin-Etsu Handotai Co., Ltd., both of Tokyo, Japan

[21] Appl. No.: 09/150,823

[22] Filed: Sep. 8, 1998

Related U.S. Application Data

[63] Continuation of application No. 08/754,252, Nov. 20, 1996, abandoned.

[30] Foreign Application Priority Data

Nov. 27, 1995 [JP] Japan .................................. 7-329436

[51] Int. Cl.$^7$ ............................ B29C 45/03; B65D 85/30
[52] U.S. Cl. ........................................ 211/41.18; 264/572
[58] Field of Search ..................... 211/41.18; 118/500; 206/454; 264/572

[56] References Cited

U.S. PATENT DOCUMENTS

| | | | |
|---|---|---|---|
| 3,480,151 | 11/1969 | Schmitt | 211/41.18 |
| 4,043,451 | 8/1977 | Johnson | 211/41.18 X |
| 4,574,950 | 3/1986 | Koe et al. | 211/41.18 |
| 5,154,301 | 10/1992 | Kos . | |
| 5,484,278 | 1/1996 | Berdan | 264/572 X |
| 5,511,967 | 4/1996 | Berdan | 264/572 X |
| 5,545,027 | 8/1996 | Kaneishi et al. | 264/572 X |

FOREIGN PATENT DOCUMENTS

| | | |
|---|---|---|
| 0 289 230 | 11/1988 | European Pat. Off. . |
| 0 682 357 | 11/1995 | European Pat. Off. . |
| 0 751 551 | 1/1997 | European Pat. Off. . |
| 7/016882 | 1/1995 | Japan . |
| 89/10629 | 11/1989 | WIPO . |

*Primary Examiner*—Peter R. Brown
*Attorney, Agent, or Firm*—Wenderoth, Lind & Ponack, L.L.P.

[57] ABSTRACT

An improvement is proposed for an injection molding method for the preparation of a wafer cassette for holding single crystal silicon wafers in alignment. While such a wafer cassette has several thick-walled portions such as reinforcement ribs, each of which is provided with a positioning groove for accurate positioning of an automatic machine for loading and unloading of wafers, such thick-walled portions in the prior art cassettes are subject to thermal shrinkage or molding sink in molding so as to cause deformation of the positioning grooves disturbing reliable positioning of the automatic machine. The improvement of the invention can be accomplished by undertaking the gas-assist method in which a gas is introduced into the cavity of the metal mold so as to form hollow cavities behind the positioning grooves to thus avoid the thermal shrinkage or molding sink due to the large wall thickness.

8 Claims, 7 Drawing Sheets

HOLDING CASSETTE FOR PRECISION SUBSTRATES AND METHOD FOR THE PREPARATION THEREOF

This is a continuation of U.S. application Ser. No. 08/754,252, filed Nov. 20, 1996 now abandoned.

BACKGROUND OF THE INVENTION

The present invention relates to a holding cassette for precision substrates, such as semiconductor single crystal silicon wafers, and a method for the preparation thereof. The method of the invention is an injection molding method for the preparation of a cassette for holding various kinds of precision substrates, such as semiconductor silicon wafers, hard disk substrates for magnetic recording medium, fused silica glass plates of photomasks for use in photolithography and so on, in storage and transportation. In particular, the invention provides a method for the preparation of a cassette for holding precision substrates suitable for mechanical loading and unloading of the substrates by means of an automatic machine.

Figure 6:
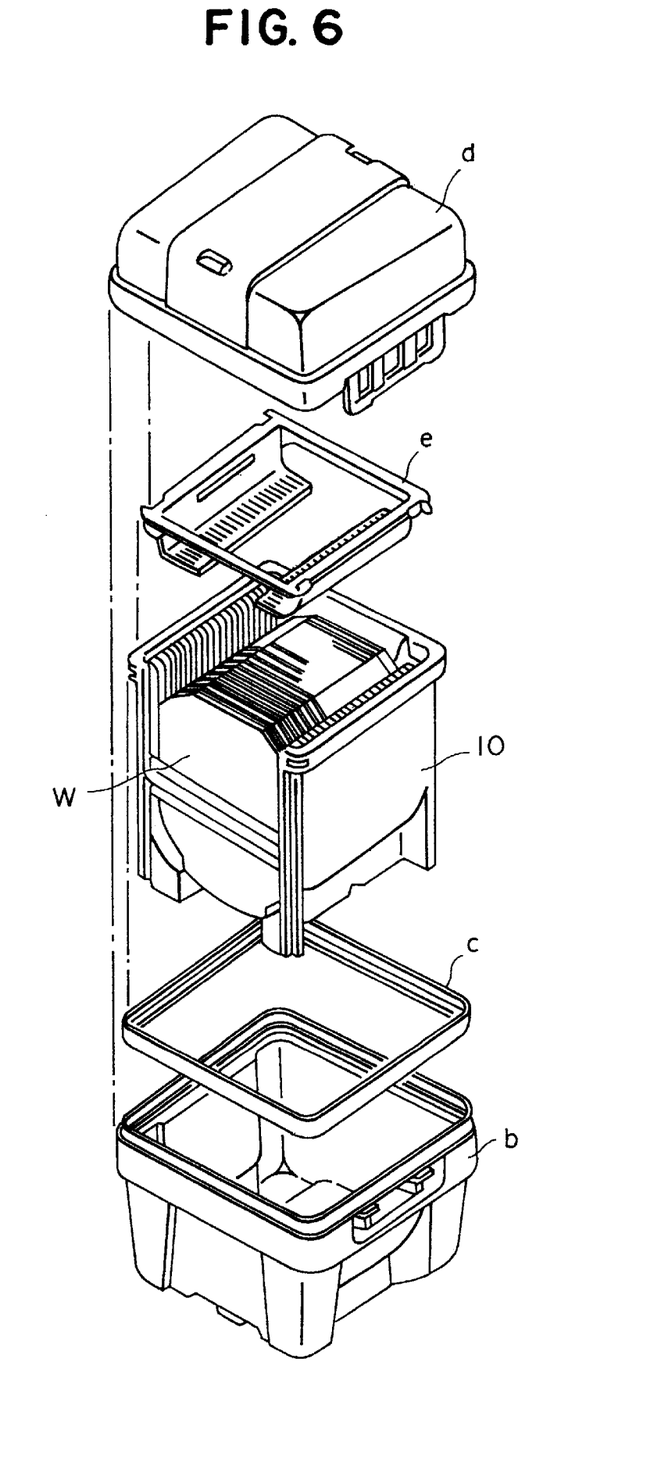
FIG. 6 is a perspective view of a wafer carrier using a wafer cassette prepared by a conventional method, as disassembled into parts.
Figure 7:
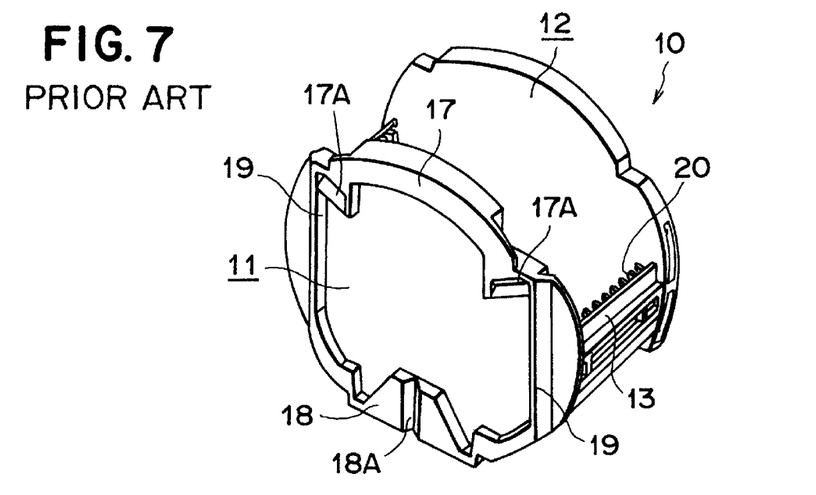
FIG. 7 is a perspective view of a conventional wafer cassette.

It is conventional that various kinds of precision substrates such as semiconductor silicon wafers and the like are contained during storage and transportation in a box container, referred to as a wafer carrier hereinafter, as illustrated in FIG. 6 of the accompanying drawings, in order for the substrate materials, referred to simply as wafers hereinafter, to be prevented from contamination by deposition of dust particles and mechanical damage by vibrations and shocks. As is illustrated in FIG. 6, which is a perspective view of a wafer carrier as disassembled into parts, a plurality of wafers W are held on a wafer cassette 10 in a parallel alignment each separated by a narrow gap space from the adjacent wafers and the wafer cassette 10 holding the wafers W is put into the box bottom b of the wafer carrier in a freely demountable fashion. A covering d is mounted on the box bottom b with intervention of an elastic sealing member c such as a rubber gasket fitting the open peripheries of the box bottom b and the covering d to ensure air-tight sealing of the wafer carrier. The wafers W or the wafer cassette 10 is secured in position by means of a wafer presser member e coming into contact with the upper peripheries of the wafers W under elastic resilience. The loading and unloading of the wafers W on and from the wafer cassette 10 are usually conducted in a clean room freed from floating dust particles as completely as possible so as to prevent deposition of microscopic dust particles on the wafers W.

Figure 8:
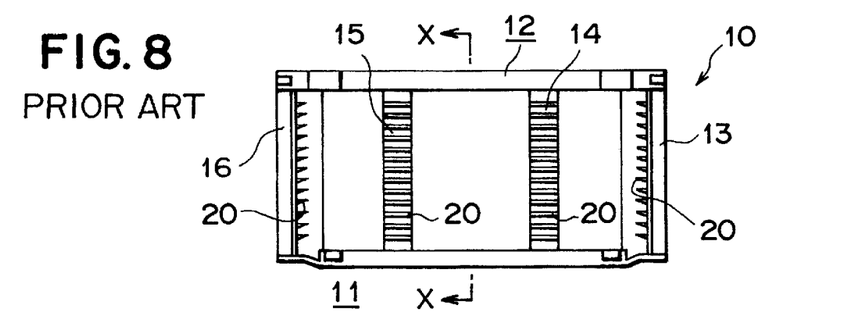
FIG. 8 is a plan view of the wafer cassette illustrated in FIG. 7.
Figure 9:
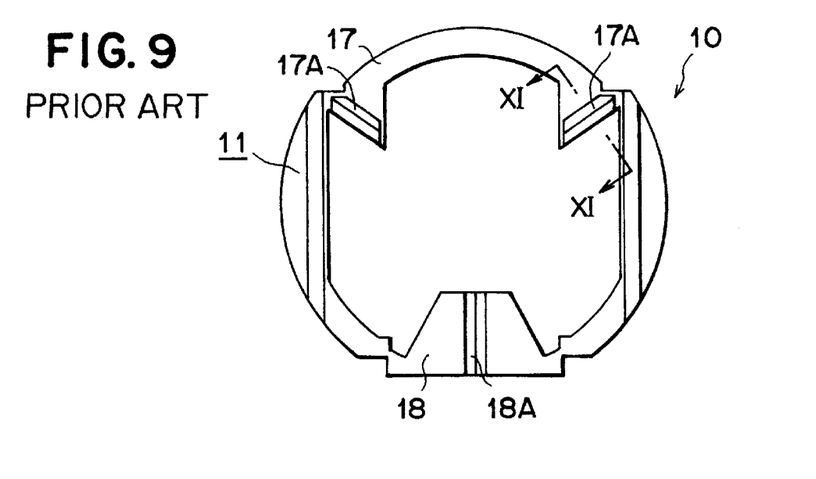
FIG. 9 is a front elevational view of the wafer cassette illustrated in FIG. 7.
Figure 10:
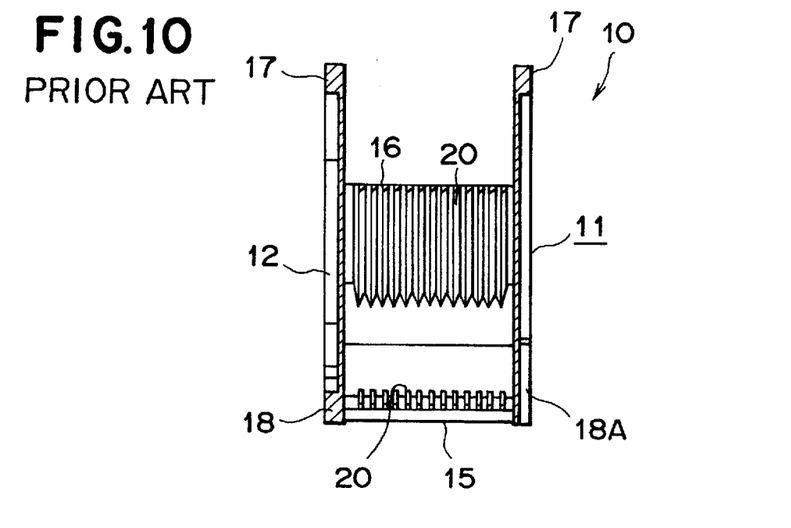
FIG. 10 is a cross sectional view of the wafer cassette as cut and viewed along the direction indicated by the arrows X—X in FIG. 8.

A typical wafer cassette is that for semiconductor silicon wafers of a large diameter as is illustrated in FIGS. 7, 8, 9, 10 and 11 showing a perspective view, a plan view, a front elevational view, a cross sectional view as cut and viewed along the direction indicated by the arrows X—X in FIG. 8 and a partial cross sectional view as cut and viewed along the direction indicated by the arrows XI—XI in FIG. 9, respectively. The wafer cassette 10 is made from a thermoplastic resin such as polypropylene resins (PP), polycarbonate resins (PC), polybutylene terephthalate resins (PBT), polyether-ether ketone resins (PEEK), perfluoroalkoxy fluorocarbon resins (PFA) and the like and integrally molded by the method of injection molding. The main part of the wafer cassette 10 consists of a pair of opposite disks 11, 12 integrally connected together with four connecting bridges 13, 14, 15, 16. Each of the disks 11, 12 is provided with a thick-walled rib 17 along the upper periphery, a thick-walled area 18 along the lower periphery and a pair of vertical ribs 19, 19 each running close to the lateral periphery of the disk 11 or 12 for the purpose of reinforcement. Each of the bridges 13, 14, 15, 16 is provided on the inwardly facing surface with a plurality of vertically running parallel grooves 20 each having a V-shaped cross section to receive the periphery of a silicon wafer W. The upper reinforcement rib 17 of the disk 11 or 12 is provided at each end with a positioning groove 17A having a V-shaped cross section. The lower thick-walled area 18 is also provided at the center with a vertically running positioning groove 18A having a V-shaped cross section.

Figure 11:
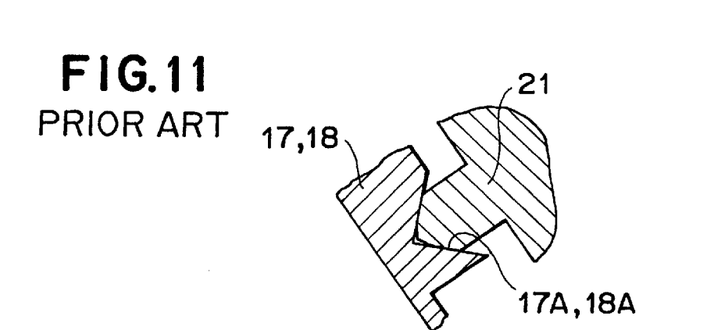
FIG. 11 is a partial cross sectional view of the wafer cassette as cut and viewed along the direction indicated by the arrows XI—XI in FIG. 9.

In the wafer cassette 10 described above, the wafers W are each inserted into a set of the receptacle grooves 20 in the bridges 13, 14, 15, 16 at the periphery to be supported thereon. The wafer cassette 10 thus holding the wafers W is then inserted into the box bottom b of the wafer carrier and air-tightly sealed therein by mounting the covering d with intervention of the elastic sealing member c therebetween to ensure cleanness and safety of the wafers W in storage and transportation. When wafers W are loaded and unloaded on and from the wafer cassette 10 by using a loading-unloading machine, the machine is secured at the proper position by bringing the tip of one of plural positioning pins 21 thereof into contact with the bottom of the V-shaped groove 17A, 18A of the thick-walled parts 17, 18 to serve as a ruling point as is shown in FIG. 11.

Figure 12:
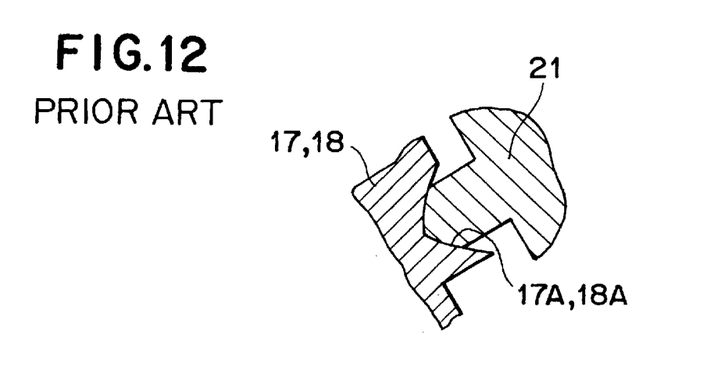
FIG. 12 is a partial cross sectional view of the wafer cassette similar to FIG. 11 for the illustration of a problem in the prior art wafer cassette.

The above described conventional wafer cassette 10 has several problems to be solved relating to the reliability of the operation of the loading-unloading machine. Due to the large thickness of the upper reinforcement rib 17 and lower thick-walled area 18 on the side disk 11, for example, these parts unavoidably exhibit a large thermal shrinkage in injection molding so that it is sometimes the case, as is shown in FIG. 12, that the groove surface of each of the positioning grooves 17, 18 has a cross section which is not exactly V-shaped but is curved with concavity so as to disturb the positioning pin 21 of the loading-unloading machine from properly contacting with the positioning grooves 17, 18 and eventually resulting in inoperability of the machine.

Figure 13:
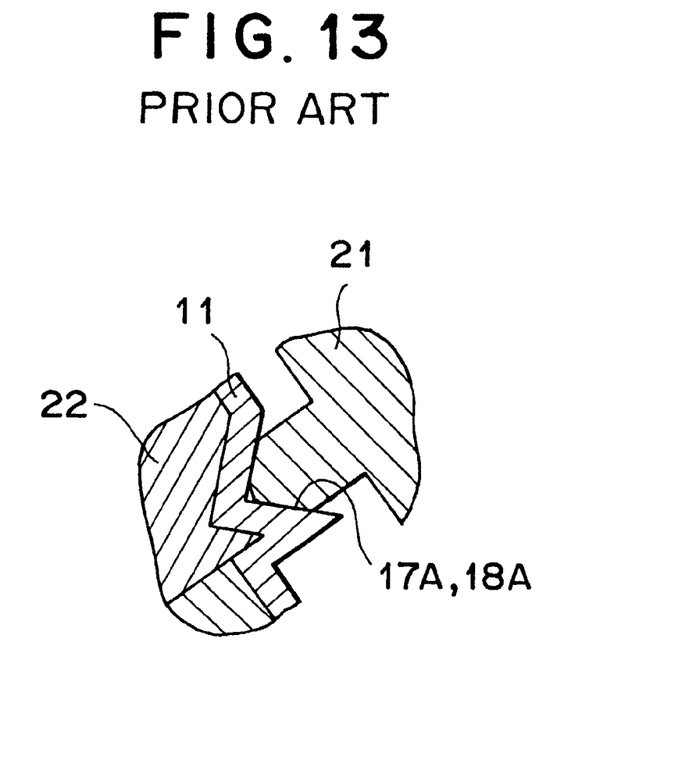
FIG. 13 is a partial cross sectional view of the wafer cassette similar to FIG. 11 for the illustration of another problem in the prior art wafer cassette.
Figure 14:
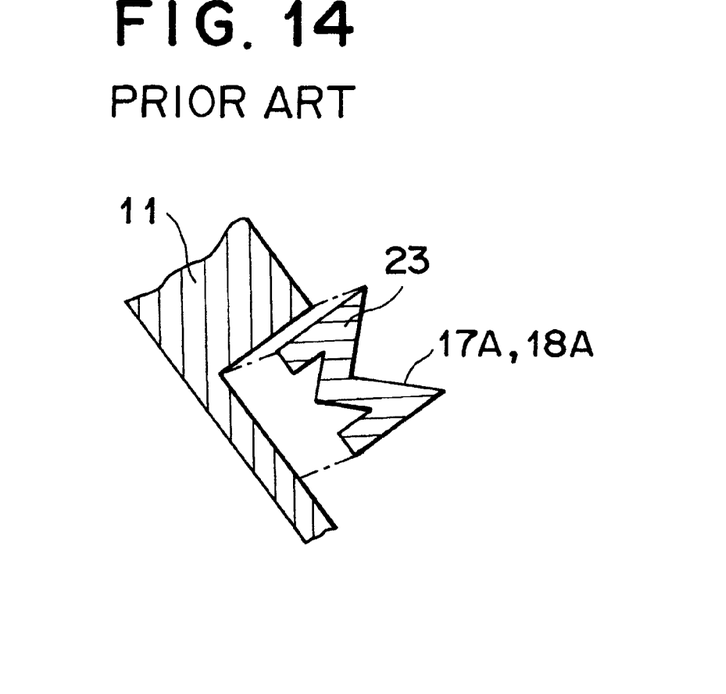
FIG. 14 a partial cross sectional view of the wafer cassette similar to FIG. 11 for the illustration of a further problem in the prior art wafer cassette.

As a remedy for the above described problem due to the large thickness of the thick-walled parts 17, 18, a method is proposed in which, as is shown in FIG. 13, a part 22 of a metal mold for injection molding is applied to the disk 11 at the inner surface so as to decrease the wall thickness at the positioning grooves 17A, 18A. Alternatively, as is illustrated in FIG. 14, each of the positioning grooves 17A, 18A is shaped as a separately molded member 23 having an M-shaped cross section which is adhesively bonded to the disk 11.

The above mentioned former method described by making reference to FIG. 13 has another problem that, since the part 22 of the metal mold forms an undercut, the metal mold must be provided with a sliding mechanism with complicacy so that the cost of the metal mold is necessarily increased. In addition, the inwardly facing surface of the disk 11 necessarily has a cavity or recess at the positioning grooves 17A, 18A playing no inherent role in the performance of the disk 11 so that the efficiency of the cleaning treatment of the wafer cassette 10 is decreased so much resulting in eventual deposition of dust particles to cause a problem in the cleanness of the wafer carrier.

The above mentioned latter method described by making reference to FIG. 14 also has problems that, needless to say, an additional metal mold must be prepared for molding of the separate member 23 and the thus separately molded member 23 must be subsequently bonded to the disk 11 so that the costs of the products are increased so much due to the initial investment for the additional metal mold and the labor-cost for the bonding operation.

SUMMARY OF THE INVENTION

The present invention, which has been completed in view of the above described problems in the prior art, has an object to provide an improved inexpensive method for the preparation of a wafer cassette suitable for reliable loading and unloading of wafer materials on and from the cassette by the use of an automatic machine without necessitating additional investments for the metal mold and other instruments and additional labor costs.

Figure 5:
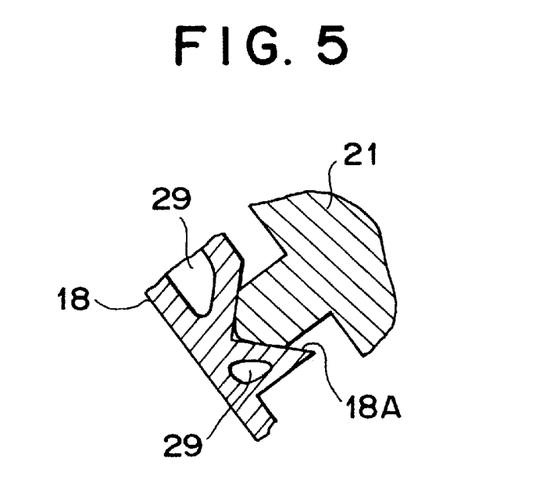
FIG. 5 is an enlarged partial cross sectional view of the wafer cassette prepared according to the inventive method showing a positioning groove and a positioning pin of a machine.

Thus, the present invention provides an improvement, for an injection molding method utilizing injection of a resin melt into a metal mold having a cavity for a wafer cassette for the preparation of a wafer cassette having parallel grooves for receiving a plurality of wafer materials in alignment, thick-walled reinforcement parts having a thickness of at least 3 mm and positioning grooves formed in each of the thick-walled reinforcement parts. The positioning grooves (for example, V-shaped grooves having inclined surfaces, as shown in FIG. 5) serve for exact positioning of an automatic machine for loading and unloading of the wafer materials on and from the wafer cassette. The improvement comprises molding the reinforcement parts and the positioning grooves in the form of a thinwalled hollow structure having a wall thickness of 3 mm or smaller by the method of gas-blowing injection molding in which, during injection of a resin melt into the cavity of the metal mold for injection molding or before complete solidification of the injected resin melt in the cavity of the metal mold, a gas is blown into the cavity of the metal mold.

It is a preferable embodiment in the above defined improved method that the gas blowing in the gas-blowing injection molding is performed by directly blowing the gas into the metal mold through a nozzle of an injection molding machine or through a gas-directing module built in the metal mold.

The invention further provides an improved wafer cassette which comprises parallel grooves for receiving a plurality of wafer materials in alignment, thick-walled reinforcement parts having a thickness of at least 3 mm and positioning grooves formed in each of the thick-walled reinforcement parts. Positioning grooves serve to provide exact positioning of an automatic machine for loading and unloading of the wafer materials on and from the wafer cassette, and the thick-walled reinforcement parts with the positioning grooves each having a hollow structure.

DETAILED DESCRIPTION OF THE PREFERRED EMBODIMENTS

As is described above, the improvement according to the present invention is accomplished by undertaking a gas-blowing injection molding method which can be a so-called gas-assist method and the like. The gas for the gas blowing can be air or an inert gas such as nitrogen. As is known, introduction of the gas into the cavity of a metal mold in the gas-assist method is conducted by introducing a compressed gas either through a gas nozzle of an injection molding machine or through a gas-directing module built in the metal mold. The method of the invention is not limitative in this regard. The inventive method is also not limitative in respect of the controlling method for gas introduction which can be performed either by controlling the gas pressure of the compressed gas or by controlling the volume or blowing rate of the gas introduction.

It is a preferable embodiment of the inventive method that gas blowing is performed at a moment of incipient solidification of the resin melt in contact with the wall surface of the cavity in order to retain a substantial thickness of the resin layer in contact with the wall surface of the cavity. It is also preferable that the gas is directly blown into the thick-walled part by the use of a gas-directing module.

By practicing the inventive method in the above described manner, a wafer cassette is obtained which comprises parallel grooves for holding a plurality of wafer materials in alignment, thick-walled reinforcing parts and positioning parts formed in each of the thick-walled reinforcement parts. The positioning grooves serve to exact positioning of an automatic machine for loading and unloading of the wafer materials on and from the wafer cassette, and the thick-walled reinforcement parts and said positioning grooves each have a hollow structure.

In the inventive method in which a gas is introduced into the cavity of the metal mold during injection of a resin melt into the cavity or at a moment after completion of injection of the resin melt but before solidification of the resin melt in the cavity, the gas flows selectively into the part for molding of the thick-walled reinforcement part with a positioning groove to form a hollow cavity so as to accomplish forming of the hollow structure of the thick-walled reinforcement parts or the positioning grooves. Accordingly, the shrinkage of the molded resin is small and the positioning grooves can be molded to have an accurate configuration so that loading and unloading of the wafers on and from the wafer cassette by using an automatic loading-unloading machine can be performed very smoothly and accurately. In addition, no additional recesses, which may disturb the cleaning operations of the wafer cassette, are formed in the wafer cassette so that the wafer cassette can be easily kept in a dust-free condition. Further, any additional metal molds need not be prepared for the preparation of a separately molded member which must be bonded to the wafer cassette at the expense of a large labor cost for bonding operations.

In the following, some embodiments of the invention are illustrated in more detail by making reference to the accompanying drawings.

Figure 1:
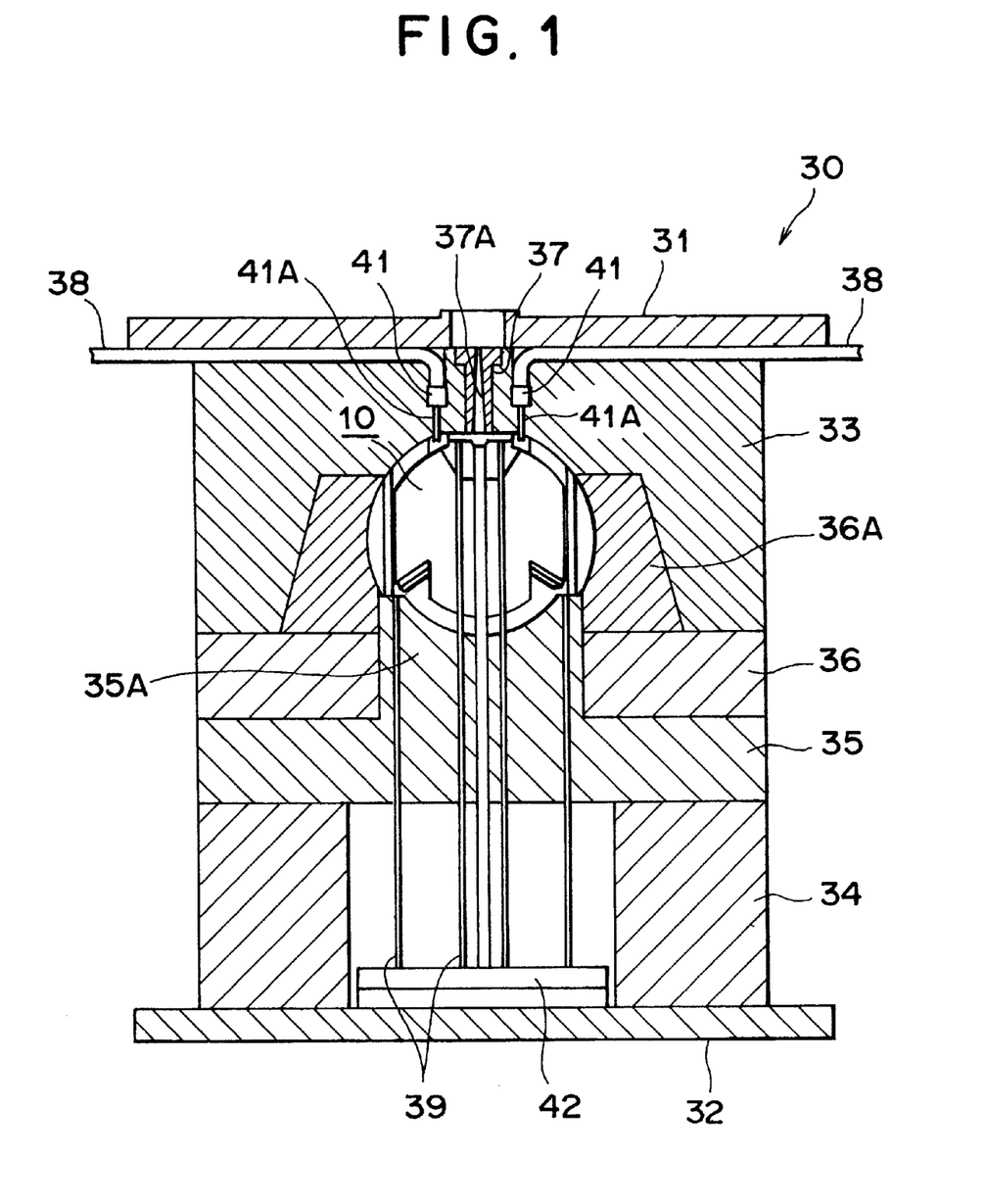
FIG. 1 is a schematic cross sectional view of a metal mold for practicing the inventive method for the preparation of a wafer cassette in an embodiment.
Figure 2:
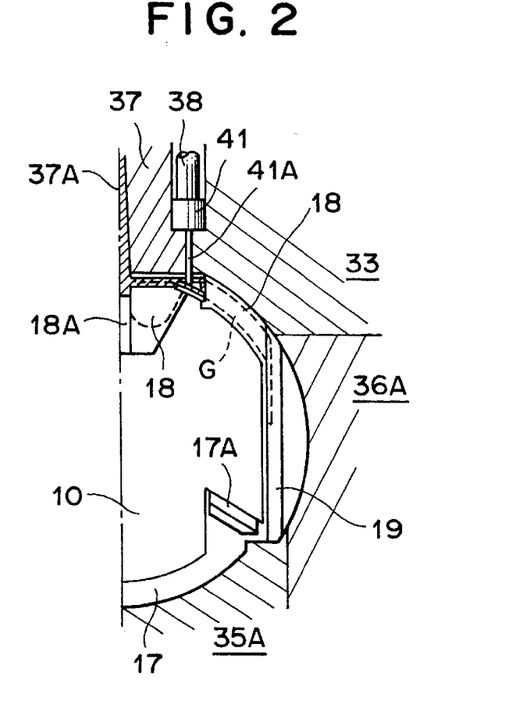
FIG. 2 is an enlarged partial cross sectional view of the metal mold illustrated in FIG. 1 at an initial stage of molding.
Figure 3:
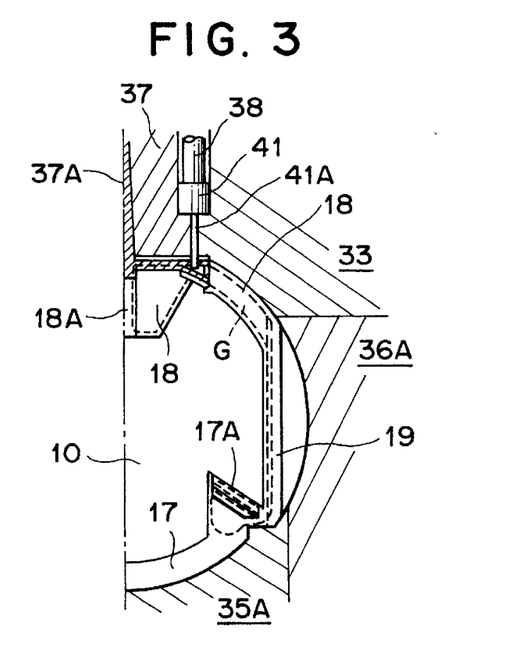
FIG. 3 is an enlarged cross sectional view of the same metal mold at a stage following FIG. 2.
Figure 4:
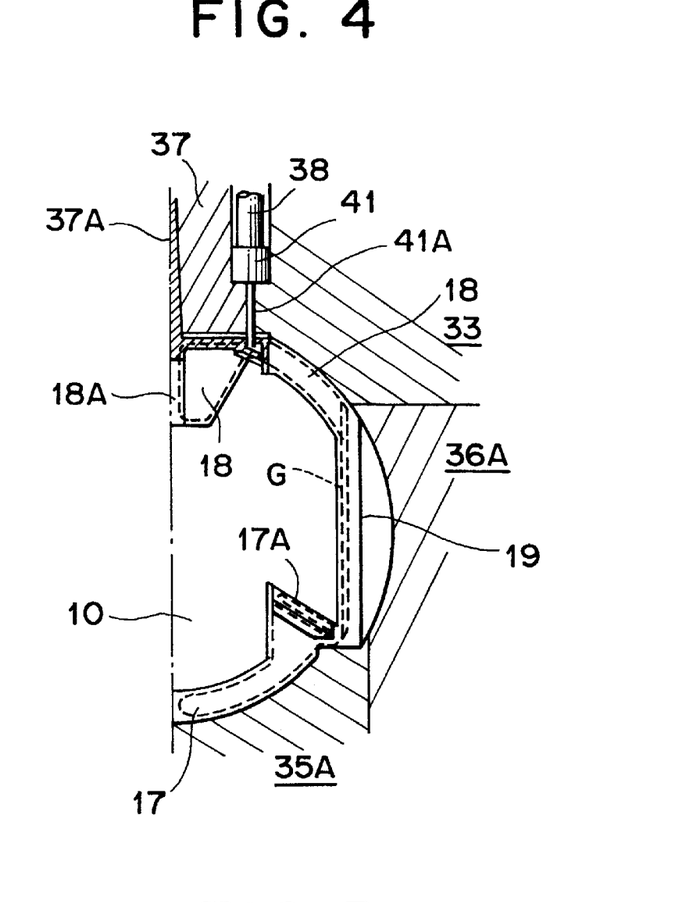
FIG. 4 is an enlarged cross sectional view of the same metal mold at a stage following FIG. 3.

FIGS. 1 to 5 of the accompanying drawings are given for the purpose of illustration of the inventive method for the preparation of a wafer cassette as an embodiment of the invention, of which FIG. 1 is a cross sectional view of the metal mold for practicing the inventive method at the starting stage of the process, FIGS. 2, 3 and 4 are enlarged partial cross sectional views of the metal mold at sequential stages of the process, and FIG. 5 is a partial cross sectional view of the thus prepared wafer cassette similar to FIG. 11. Incidentally, the wafer cassette prepared by the inventive method has a structure generally identical with a conventional wafer cassette illustrated in FIGS. 7 to 10.

As is illustrated in FIG. 5 by an enlarged partial cross sectional view, the positioning groove 18A of the wafer cassette is provided by forming the lower reinforcement area 18, which has an increased thickness in the conventional wafer cassette, on the disk 11 to have hollow cavities 29, 29 which are formed by the gas-assist molding method as is described later. This description is applicable also to the upper and side reinforcement ribs 17, 19, which are thick-walled in the conventional wafer cassette but are formed with hollow cavities in the present invention.

The wafer cassette 10 of the invention is molded by using the metal mold assembly 30 illustrated in FIG. 1 by a cross sectional view, in which a fixed-side mounting plate 31 serves to fix the assembly 30 to the base (not shown in the figure) of the molding machine while a movable-side mounting plate 32 is joined to the base of the machine in such a fashion as to be capable of ascending and descending by means of an elevator mechanism and the like. A fixed-side retainer plate 33 is joined to the fixed-side mounting plate 31 while a vertically movable retainer plate 35 is joined to the movable-side mounting plate 32 with intervention of a spacer block 34, the vertically movable retainer plate 35 supporting a slidable retainer plate 36 in a slidable fashion.

When the metal mold 30 is closed, the fixed-side retainer plate 33 defines the cavity (numbered as 10 in the figure) for molding of the wafer cassette together with the above mentioned vertically movable retainer plate 35 and the slidable retainer plate 36, and a sprue bush 37 is provided to appear in the cavity 10. The cavity 10 in FIG. 1 is designed to mold the wafer cassette in an upside-down disposition.

A sprue 37A is formed in the sprue bush 37 to communicate with an external resin melt feeder (not shown in the figure) and the sprue 37A communicates also with the cavity 10 through a runner and the like (not shown in the figure). A gas-directing module 41 having a tubular nozzle 41A is provided as interposed between the outer surface of the sprue bush 37 and the fixed-side retainer plate 33. The tubular nozzle 41A opens at the end in the cavity 10 at the position corresponding to the lower thick-walled area 18 or, in other words, at the part having an increased cross sectional area.

The gas-directing module 41 is connected to a gas feeder tube 38 which in turn communicates with a high-pressure gas source for nitrogen gas and the like (not shown in the figure) after passing through the space between the fixed-side mounting plate 31 and the fixed-side retainer plate 33. As is described later, the gas-directing module 41 injects a volume of gas such as nitrogen into the cavity 10 through the tubular nozzle 41A during injection of the resin melt into the cavity 10 or after completion of the injection of the resin melt but before solidification of the resin melt in the cavity 10.

The vertically movable retainer plate 35, which defines a part of the cavity 10, has a core 35A and the slidable retainer plate 36 has a core 36A. These cores 35A, 36A define, jointly with the above mentioned fixed-side retainer plate 33, the cavity 10. The core 35A of the vertically movable retainer plate 35 is penetrated in a freely slidable fashion by several ejector pins 39 standing upright on the plate 42 and each driven by a driving mechanism (not shown in the figure). The vertically movable retainer plate 35 is driven up and down and the slidable retainer plate 36 is driven in the right to left and left to right directions of FIG. 1.

Following is a description of the procedure for molding of a wafer cassette in the above described embodiment. In the first place, as is illustrated in FIG. 1, a cavity 10 is formed by clamping the fixed-side retainer plate 33, vertically movable retainer plate 35 and slidable retainer plate 36, and a melt of a resin such as a PFA resin or the like is injected into the cavity 10 through the sprue 37A. A gas is introduced into the cavity 10 through the gas-directing module 41 during injection of the resin melt or after completion of the injection of the resin melt but before full solidification of the resin melt in the cavity 10.

The gas G introduced into the cavity 10 from the gas-directing module 41 through the nozzle 41A flows into the part for molding of the lower thick-walled area 18 in the cavity 10, wherefrom the gas G flows selectively, as is illustrated in FIGS. 2, 3 and 4 by a dotted line, to the parts of the cavity 10 for molding the side reinforcement ribs 19 and the upper reinforcement rib 17 (such that they constitute unitary, integral thick-walled reinforcement parts) or, in other words, to the parts having a relatively large cross section successively, to form hollow cavities 29 around the positioning grooves 17A, 18A in the thick-walled portions 17, 18. By virtue of the thus formed hollow cavities 29 surrounded by cavity walls of a relatively small thickness of, for example, 5 mm or smaller or, preferably, 3 mm or smaller in order to avoid the defects due to molding sink, the wafer cassette 10 cooled down to be solidified suffers little thermal shrinkage so that the positioning grooves 17A, 18A are prevented from deformation.

In the embodiment of the present invention, as is described above, the wafer cassette 10 is molded by applying the gas-assist method so as to form isolated hollow cavities 29 in the thick-walled portions where positioning grooves 17A, 18A are to be formed. Accordingly, the wafer cassette 10 suffers little thermal shrinkage or sink by molding even in the thick-walled portions so that the positioning grooves 17A, 18A are prevented from deformation and thus keep an accurate configuration. In this way, no undercut is formed in the wafer cassette 10 as is illustrated in FIG. 13 so that the injection molding can be performed by using a metal mold assembly of a relatively simple structure without any complicated design for an undercut. It is also an advantage of the invention that no additional or separate members for the positioning grooves, as is illustrated in FIG. 14, need not be prepared for subsequent bonding operations.

Thus, the inventive method provides a possibility of providing accurately molded wafer cassettes at low costs.

While, in the above described embodiment of the invention, the gas for the gas-assist method is introduced into the cavity 10 of the metal mold 30 at the upper position thereof corresponding to the lower thick-walled area 18 of the wafer cassette 10, it is of course optional to introduce the gas at the lower position of the cavity 10 without particular limitations. Needless to say, the applicability of the principle of the present invention is not limited to the positioning grooves 17A, 18A but to any other thick-walled parts such as open holes, protrusions and the like to serve the purpose of positioning of an automatic loading-unloading machine.

What is claimed is:

1. A wafer cassette comprising:

parallel grooves for receiving a plurality of wafer materials in alignment; and thick-walled reinforcement parts respectively having wall thicknesses of at least 3 mm;

wherein each of said thick-walled reinforcement parts has a V-shaped positioning groove formed therein each of said V-shaped positioning grooves having inclined surfaces for contacting and aligning a positioning pin of an automatic wafer loading/unloading machine to accurately position the loading/unloading machine;

wherein each of said thick-walled reinforcement parts is formed unitarily with and as an integral part of said wafer cassette; and wherein each of said thick-walled reinforcement parts has at least one hollow cavity formed therein at said respective V-shaped positioning groove to define cavity walls thereabout having cavity wall thicknesses which are thinner than the respective thick-walled reinforcement part, said at least one hollow cavity being formed at said respective V-shaped positioning groove such that said inclined surfaces are free of concavity formed by molding shrinkage.

2. The wafer cassette as claimed in claim 1, wherein each of said hollow cavities comprises an isolated hollow cavity.

3. The wafer cassette as claimed in claim 2, wherein for each of said thick-walled reinforcement parts, said at least one hollow cavity comprises plural hollow cavities.

4. The wafer cassette as claimed in claim 3, wherein said thick-walled reinforcement parts have three V-shaped positioning grooves.

5. The wafer cassette as claimed in claim 2, wherein said thick-walled reinforcement parts have three V-shaped positioning grooves.

6. The wafer cassette as claimed in claim 1, wherein for each of said thick-walled reinforcement parts, said at least one hollow cavity comprises plural hollow cavities.

7. The wafer cassette as claimed in claim 6, wherein said thick-walled reinforcement parts have three V-shaped positioning grooves.

8. The wafer cassette as claimed in claim 1, wherein said thick-walled reinforcement parts have three V-shaped positioning grooves.

* * * * *